United States Patent [19]
Meuth et al.

[11] Patent Number: 5,694,094
[45] Date of Patent: Dec. 2, 1997

[54] NARROW BAND ARBITRARY HF MODULATION AND NOISE GENERATOR

[75] Inventors: Hermann Meuth, Rossdorf; Günter Heinrichs, Wassenberg; Alexander Schnase, Würselen; Hans Stockhorst, Bonn, all of Germany

[73] Assignee: Forschungszentrum Jülich GmbH, Jülich, Germany

[21] Appl. No.: 666,406

[22] PCT Filed: Dec. 13, 1994

[86] PCT No.: PCT/DE94/01479

§ 371 Date: Jun. 12, 1996

§ 102(e) Date: Jun. 12, 1996

[87] PCT Pub. No.: WO95/17039

PCT Pub. Date: Jun. 22, 1995

[30] Foreign Application Priority Data

Dec. 14, 1993 [DE] Germany ............... 43 42 520.8

[51] Int. Cl.⁶ .................. H03B 29/00; H03C 5/00
[52] U.S. Cl. .................. 332/119; 332/117; 332/144; 332/149; 331/78
[58] Field of Search .................. 332/117, 119–122, 332/144, 149; 331/78; 327/164; 364/717; 370/107; 455/1, 67.5

[56] References Cited

U.S. PATENT DOCUMENTS 5,329,260 7/1994 Poplin .................. 332/119
5,570,307 10/1996 Takahashi .................. 331/78 X

*Primary Examiner*—David Mis
*Attorney, Agent, or Firm*—Herbert Dubno

[57] ABSTRACT

A high frequency arbitrarily modulated signal and noise generator utilizes digital numerically controlled oscillators providing interbusiness directly to an adder and which are phase modulated. The digital adder feeds a digital analog converter, eliminating the need for a digital multiplier while providing amplitude or phase modulation with high resolution and at high processing speeds.

4 Claims, 4 Drawing Sheets

NARROW BAND ARBITRARY HF MODULATION AND NOISE GENERATOR

CROSS REFERENCE TO RELATED APPLICATIONS

This application is a national phase of PCT/DE 94/01479 filed 13 Dec. 1994 and based, in turn, upon German national application P 43 42 520.8 of 14 Dec. 1993 under the International Convention.

FIELD OF THE INVENTION

The invention relates to a generator for high frequency (HF) oscillations as well as to a process for arbitrary HF modulation. It does not however relate to pure oscillations. Rather variations in time (modulation) of the three HF parameters, frequency, phase and/or amplitude can be used to communicate information.

BACKGROUND OF THE INVENTION

High frequency modulation functions can be selectively (arbitrarily) chosen as long as the character content of the HF oscillation is not entirely lost (narrow band character). In the generation of noise, certain random conditions underlie the modulation functions.

In measurement technology, increasingly frequency modulation sources and amplitude modulation sources and especially noise sources are used which must cover a characteristic frequency range. These methods enable simultaneous determination of relevant, possibly correspondingly weighted, frequency components. For audio purposes this is almost always customary since in speech transmission the respective determinations of a single frequency component does not allow any logic conclusions.

Such techniques are also of interest in the high frequency sector because of the modulation requirements of present day multichannel transmission. HF modulated signals arise in communication transmission. For test measurements of transmission lines with coded signals, noise signals are desirable or required. Modulation signals and noise signals in the high frequency sector, i.e. for frequencies of greater than several megahertz could heretofore only be realized by analog frequency conversion processes.

In one such conversion process, the modulation component or noise component low-frequency analog or digital is generated by means of a signal source and subsequent filters and thereafter is shifted in frequency in an analog sense.

This shift by a predetermined carrier frequency is brought about by a frequency mixer. The variation of the carrier and modulation characteristic or noise characteristic are effected separately for the measurement technology, the latter by variation in the filter parameters. This sequential process gives rise to errors in the resulting signals. Using this process a modulation or noise signal is obtained with a shifted frequency (carrier) which is the same to both sides, i.e. is symmetric.

A mathematically precise synthesis and affect upon the signal is not possible by this earlier process. To characterize a measured object a time-shifted evaluation of the measurement signals applied to the measured object and the measured signals after they have traversed the measured object is required.

Where only one measurement channel is available there are enhanced requirements as to the invariance with time (reproducibility) while in the case of the channels there is an enhanced requirement for synchronism of both channels. As a consequence in addition to the test measurement on the measured object, continuous calibration and comparison measurements are required.

A purely digital directly synthesized signal can by contrast in principle be precalculated. Systematic deviations can be compensated by anticipatory compensation. Directly synthesized noise signals are generated today in the audio range by arbitrary word generators whereby for frequencies up to the kilohertz range a continuous computation in real time is possible.

In the high frequency range, this process cannot be used any longer since the output speeds of such word generators cannot approach the rapid change in time of the signals and/or a sufficient storage time is not available. A calculation in real time is excluded on technical grounds. A limited storage depth can indeed be made competitive by a periodic output of a word sequence but this however is not suitable for noise generation of higher quality characterized by aperiodicity.

SUMMARY OF THE INVENTION

The invention resides in the suitable modulation in accordance with prior calculation of the phases of two parallel running numerically controlled oscillators (NCO). The two thus generated signal sequences are added to achieve a simultaneous correlated amplitude modulation and phase modulation of the resulting HF signal as may be desired. The total signal generation of the process is effected purely digitally. Results and tolerances are thus precisely precalculatable and always reproducible.

This solution for a purely digital narrow band HF modulation generator is based upon the commercial availability of integrated circuitry; it permits by comparison with other conceivable solutions, the highest data processing rate possible at the present time and thus the highest resolution in time of the generated signals. The use of earlier generally customary analog modulation processes is not possible.

The process of the invention is purely digital; it does not utilize frequency conversion and filtering and is not limited as to the modulation and noise signals which are formed by the details of frequency conversion and filtering. What is required is only a certain limitation of the modulation signals or noise signals to the range of the carrier (narrow band modulation or narrow band noise). This limitation is not substantial for the measurement technology field since even here a certain band limitation is desired. The complexity of the process is shifted to the prior value calculation for which an efficient mathematical process is also available and which can utilize a computer-supported procedure. Thus modulation or noise characteristics can be generated which were not available from prior methods. The precalculation requires also a return to value storage. By comparison to processes utilizing arbitrary word generators, the invention can provide an order of magnitude better memory utilization which is multiplied correspondingly to the signal periodicity and thus more closely approaches ideal modulation or noise behavior.

BRIEF DESCRIPTION OF THE DRAWING

The above and other objects, features, and advantages will become more readily apparent from the following description, reference being made to the accompanying drawing in which.

SPECIFIC DESCRIPTION

Figure 1:
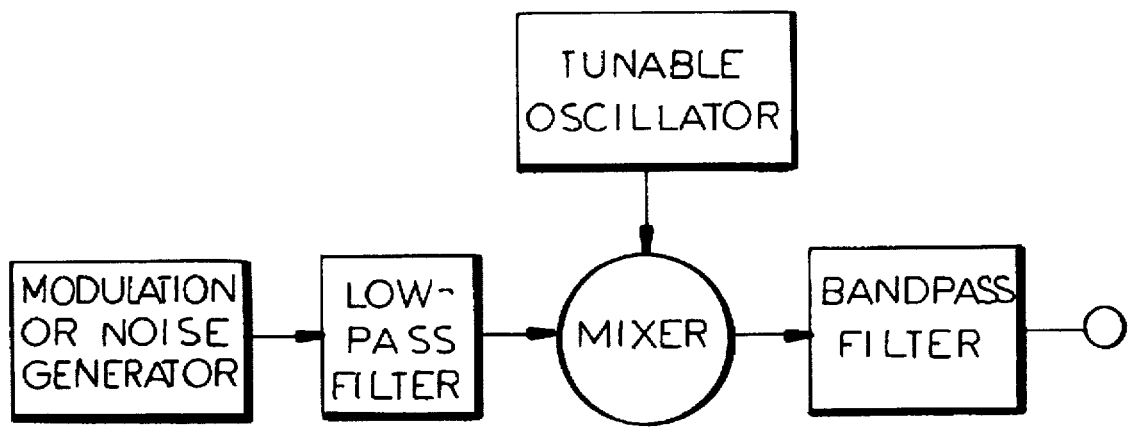
FIG. 1 is a block diagram illustrating a possible noise generator explaining the operation of a numerically controlled oscillator in connection therewith.

A digital modulation generator or noise generator can be constructed in accordance with the schematic of FIG. 1 for a digital realization. As long as a narrow band modulation signal or noise signal is to be produced in the technical realization, however, one does not start with a digital source with a certain modulation or white noise with subsequent filtering. Rather, here one uses an oscillator that generates characteristically a pure frequency signal. A digital controlled oscillator (NCO) finds use as the oscillator here. Such NCOs are commercially available as integrated circuit components. The desired modulation signal or noise signal is generated by simultaneous amplitude modulation and phase modulation of the NCOs. With respect to the desired precision, these modulations can be generated from the first by a digital system.

(a) Computation process for general HF modulation:

Initially a complex signal sequence in the time range $S(t)$ is generated.

Decomposition of this sequence to the amplitude modulation and phase modulation sequences $A(t)$ and $\Psi(t)$:

$$S(t)=A(t) \exp [i\Psi(t)] \exp [i2\pi ft]$$

For a given carrier frequency $f$, one obtains:

$$A(t) = \sqrt{S^*(t)S(t)} \quad \text{and} \quad \psi(t) = \text{arc}ig \left[ i \frac{S^*(t)\exp i2\pi ft - S(t)\exp - i2\pi ft}{S^*(t)\exp i2\pi ft + S(t)\exp - i2\pi ft} \right].$$

With this process, value limited signal sequence, especially for band limited noise, can be generated by means of a modulatable oscillator.

(b) The computation process for noise signal generation as a basis for the present invention requires the understanding that narrow band noise signals can be described as modulation signals. For this-purpose mathematical, algorithmic and technical possibilities are provided. The mathematical basis of the process is generally valid and exact. The actual boundaries of a technical realization are only set by the miniaturization limits of the electronic integrated circuitry with the associated packing density and minimal signal transit times.

The computation process should be carried out for a specifically desired noise signal of the signal sequence $S(t)$ and the modulation parameters (data sequences) A and $\Psi$ following therefrom as described under point (a) above. Processes already exist for the numerical generation of white noise. To generate narrow band noise there are the following possibilities;

The sequences for generating white noise are produced by commercial methods (FFT) in the frequency domain and correspondingly filtered thereto to the desired noise characteristics. The resulting data sequences in the frequency domain are thereafter fed back again into the time domain and establish (a) desired signal sequences $S(t)$. The following process has significant advantages.

A direct method gives the sequences $S(t)$ by direct calculation in the time domain as a superimposition of very many weighted characteristic frequency components in the desired noise band, whose relative phases are selected randomly (scanning in the frequency domain). This process avoids entirely the forward and back sweep over the frequency domain by FFT and does not impose any limitations in principle in terms of the sequence length. This process is a significant component of the invention.

Figure 2:
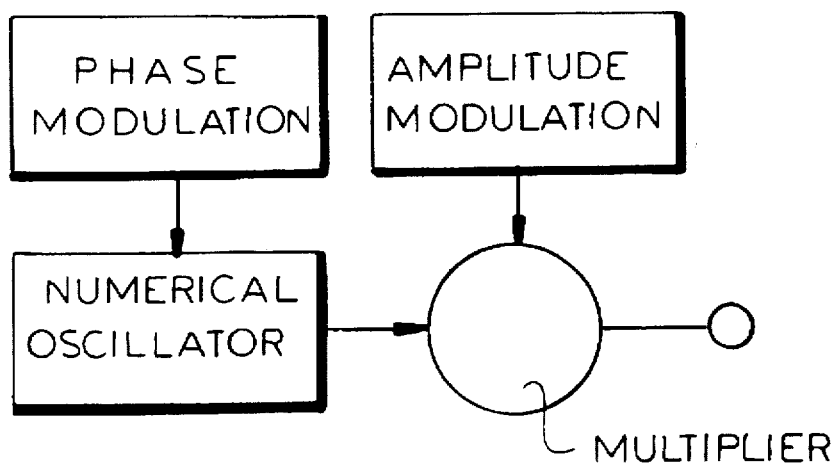
FIG. 2 is a block diagram showing another aspect of phase modulation of a numerically controlled oscillator.

(c) Realization of the modulation process with the aid of an NCO and a multiplier (FIG. 2).

Commercially available numerical oscillators operate with few exceptions via a phase modulatability, but (apart from an exception at lower clock frequencies) not via an amplitude modulatability. Amplitude modulatability by the addition of a multiplier is thus obvious since it is customary in the analog realm. Multipliers are available as digital circuits allowing in the available versions only a limited data rate. The sweep speed of the overall circuit and thus the switching speed required to realize carrier frequencies are at the present time limited by the multiplier. This limitation is, however, not of a principle nature but rather depends upon the present availability of commercial components. This process is generally known from the literature. Data sheets form corresponding component manufacturers refer to this possibility.

Figure 3:
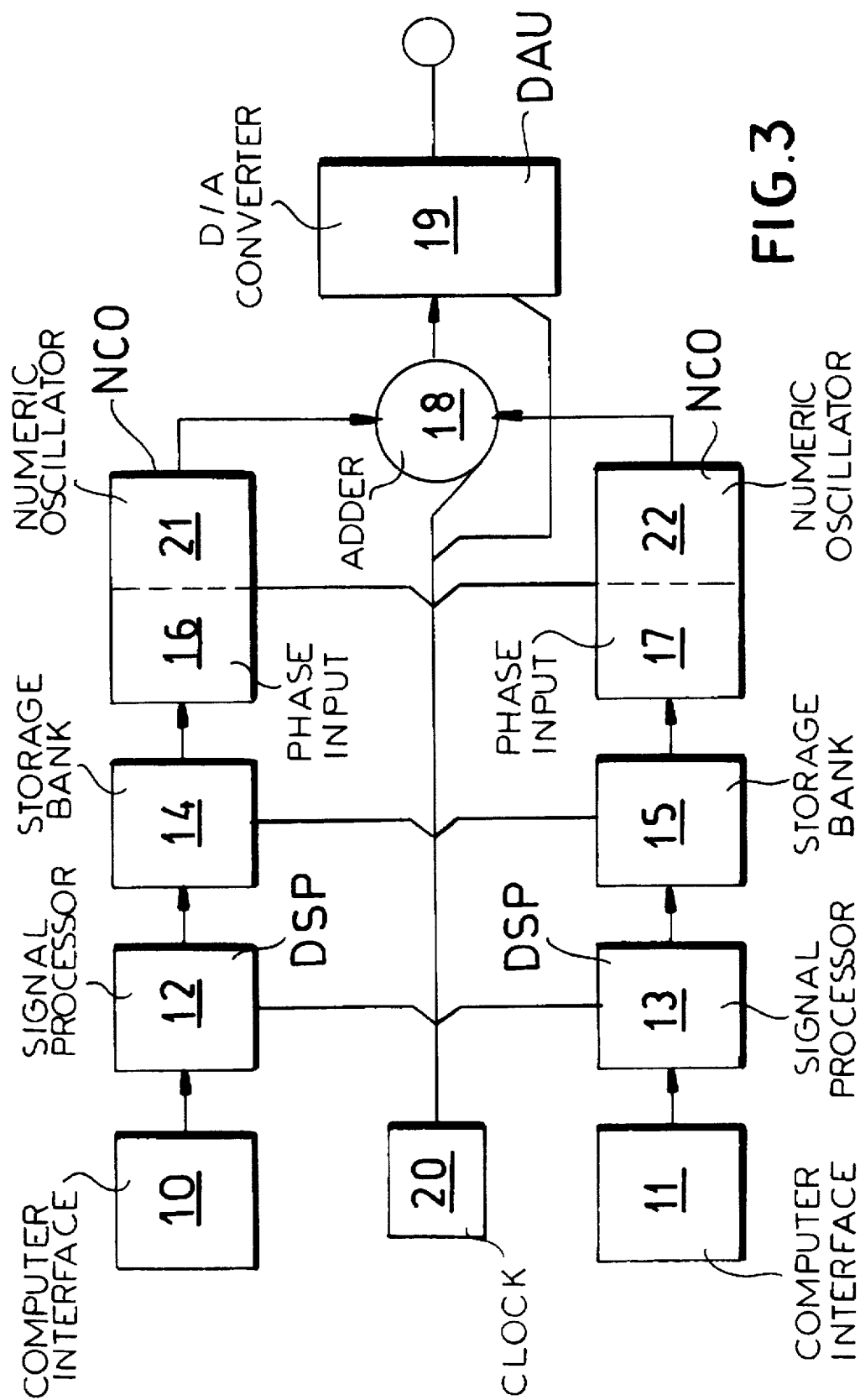
FIG. 3 is a block diagram of the best mode embodiment of the invention.

DESCRIPTION OF THE BEST MODE (d) Realization of the modulation process with the aid of two NCOs and an adder (FIG. 3).

An equivalent but entirely technically new type of amplitude modulation, by contrast, is realized by superimposing two suitable phase modulated NCOs. This process cannot be realized with analog components. Only NCOs with a common mother oscillator (clock generator) can guarantee the required long term fixed phase correlation. The respective phase modulation sequences for the two NCOs are calculated from the sequences given at (a) as $$A(t) = \sqrt{S^*(t)S(t)} \quad \text{and} \quad \psi(t) = \text{arc}ig \left[ i \frac{S^*(t)\exp i2\pi ft - S(t)\exp - i2\pi ft}{S^*(t)\exp i2\pi ft + S(t)\exp - i2\pi ft} \right].$$

The superimposition of the two NCO signals themselves is effected by a digital adder whose circuit cost is substantially smaller than that for a multiplier. Adders are available as digital circuits but because of their simple construction, can also permit simple assembly (hybridization) from individual circuit cells. Thus adders are realizable with circuit speeds customary with today's NCOs.

The actual technical product functionally described here can have carrier frequencies of up to about 10 MHz with modulation band width of more than 100 KHz (usually up to 10% of the carrier frequency). It is based upon commercially available and cost effective electronic components. Components with broader power characteristics are already available; however, their use is limited by a reason of cost. Higher carrier frequencies up to 50 MHz are today possible.

The embodiment described can be assembled modularly from circuit boards which themselves are largely made from commercial highly integrated circuits. It involves two cards with numerically-controlled oscillators, a clock generator card, two digital signal processor cards and one adder card with a following digital-analog converter card. This solution for a pure digital narrow band HF modulation generator is oriented to the commercial availability of integrated circuits; it allows by comparison to the other conceivable solution, the highest data processing rate of thus the highest resolution in time of the generated signals.

Figure 4A:
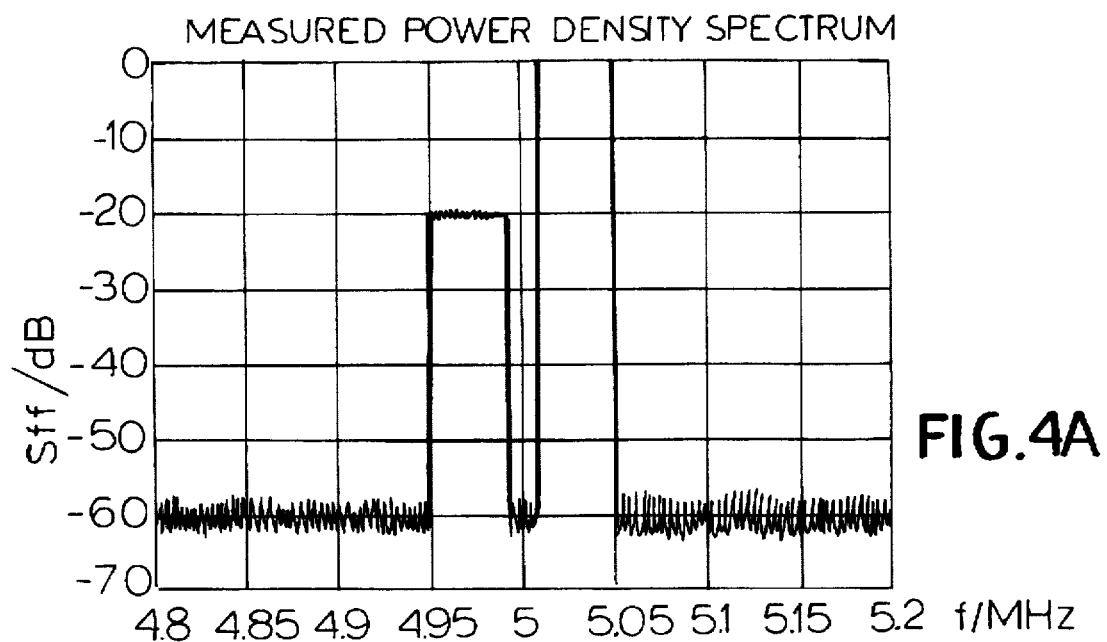
FIGS. 4A and 4B are examples of two actually realizable noise spectra obtainable with the system of FIG. 3 and plotting power vs. frequency.
Figure 4B:
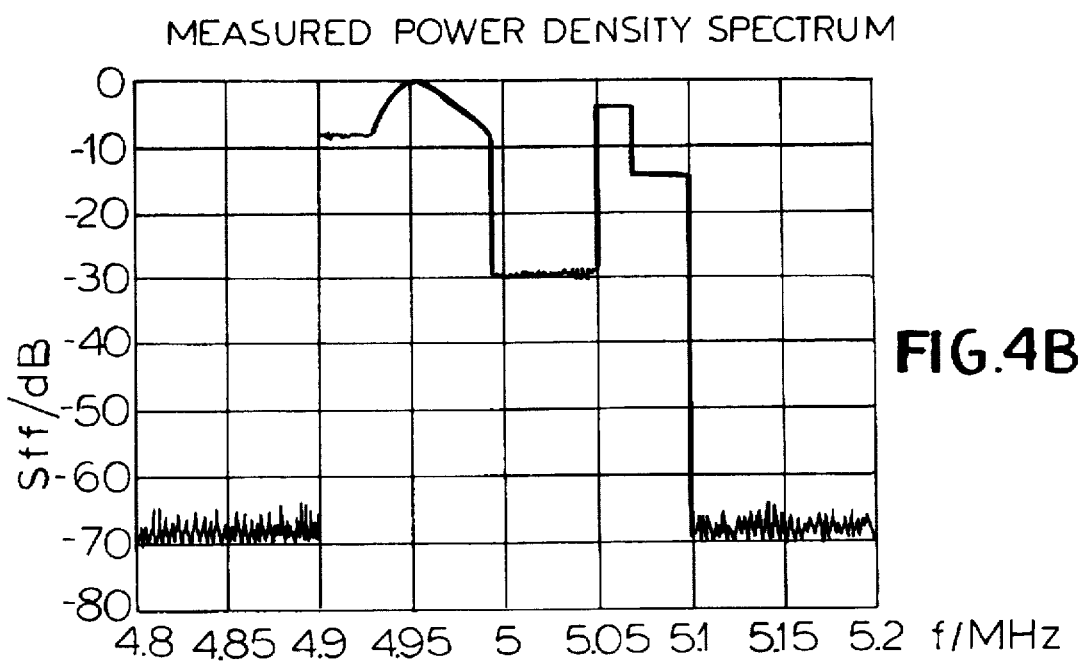

With the described practical embodiment, it is possible to generate the noise spectrum (selectively configurability) shown for example in FIG. 4 with its sharper limitation in the frequency domain with a characteristic slope of 1 dB/Hz and the free choice of the pass band behavior.

The subject of the invention is thus a narrow band HF modulation generator with the possibility of arbitrary pure digital synthesized amplitude modulation and phase modulation with free frequency variation which is especially suitable for narrow band HF noise generation. The generator is comprised of the following functional blocks (FIG. 3).

(a) Two signal processors (DSP), (b) Two numerical controlled oscillators (NCO), (c) Clock generator (CLOCK), (d) Digital adder (+), (e) Digital-Analog-Converter (DAU), (f) Computer interface for control.

HF modulation or HF noise generation is effected by suitable parallel phase modulation sequencing of the NCOs precalculated in the processors with subsequent signal summing. The sequences result from a scanning in the frequency range and require no filtering.

This allows, in contrast to conventional methods, overlong sequences with corresponding hitherto unattainable frequency resolution. The process is only possible with a digital realization. The results of tolerances are precisely precalculatable and always reproducible.

As can be seen from FIG. 3 in greater detail, two computer interfaces 10 and 11 supply the signals which are processed by the signal processors 12 and 13, previously described which represent phase sequences to be inputted to the numerically controlled oscillators but which are then stored in the respective storage or memory banks 14 and 15 before being fed to the phase inputs 16 and 17 of the numerically controlled oscillators 21 and 22 respectively.

The outputs of the phase modulated parallel running numerically controlled oscillators are thus digitally added in an adder 18 without further use of a digital multiplier and the output of the adder is supplied to the digital-analog converter 19. The signal processors 12, 13, the memory banks 14, 15, the numerically controlled oscillators 21, 22, the adder 18 and the digital-analog converter 19 receive inputs from the clock 20.

Figure 5:
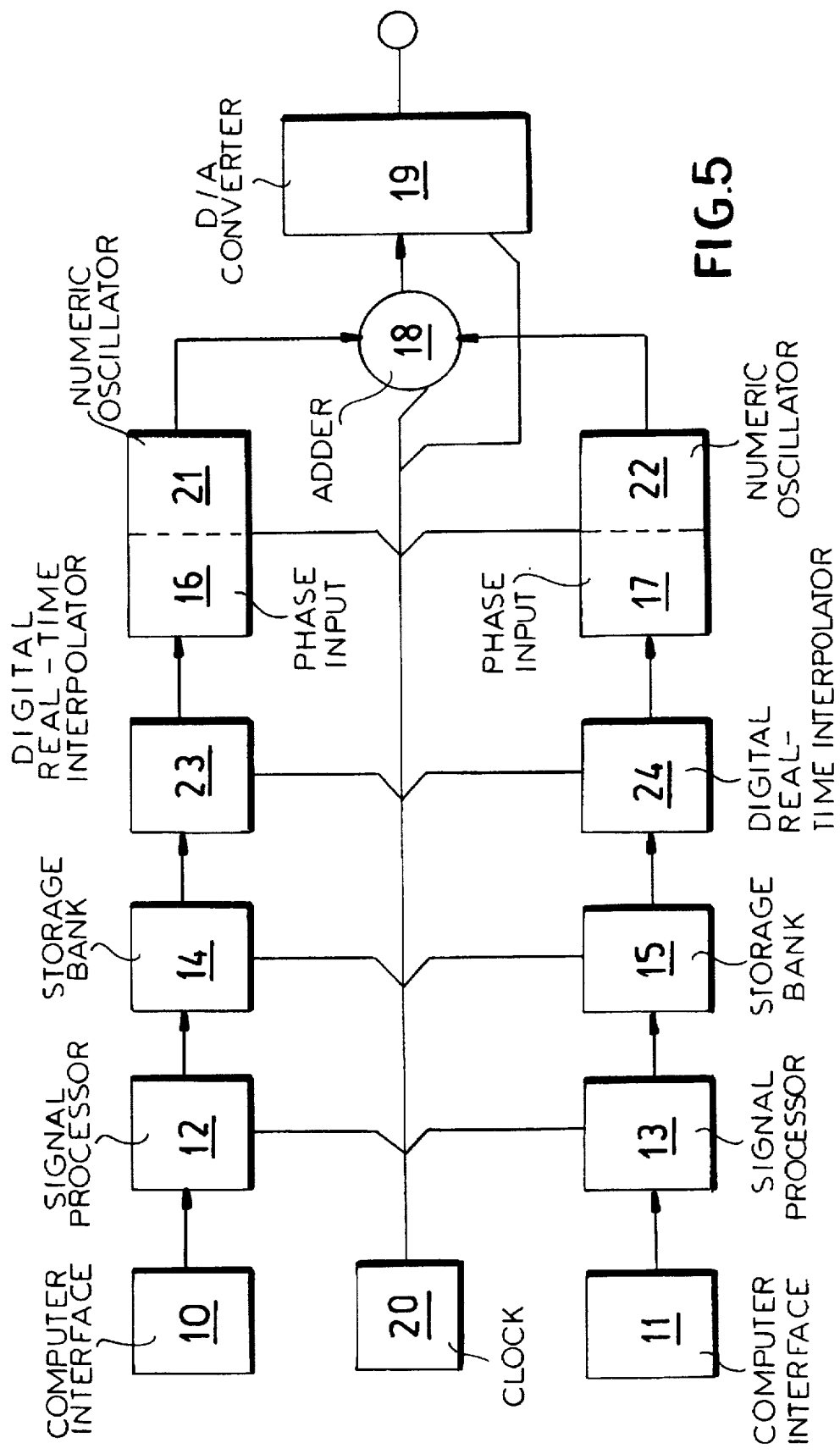
FIG. 5 is a view similar to FIG. 3 showing another embodiment of the invention.

FIG. 5 shows the circuit of FIG. 3 with its computer interfaces 10, 11, its signal processors 12, 13, fits memory banks 14, 15, the phase inputs 16, 17 and the numerically controlled oscillators 21, 22 as described in connection with FIG. 3 but wherein the two stored phase sequences are extended in time by two parallel digital real-time interpolators 23 and 24 for producing high-frequency resolution.

We claim:

1. A digital high frequency modulation generator with selection of the modulation of frequency, phase and amplitude, comprising:

two parallel running digital numerically controlled oscillators;

a digital adder directly receiving outputs from said numerically controlled oscillator;

a digital-analog converter connected to said adder; and means for phase-modulating said numerically controlled oscillators so that a modulation is effected solely by means of the phase modulated parallel running numerically controlled oscillators whose signals are digitally added without further use of a digital multiplier.

2. The digital high frequency modulation generator defined in claim 1 comprising means for inputting two phase sequences to said numerically controlled oscillators precalculated and supplied from two parallel running processors and stored in two parallel memory banks for subsequent real time transmission to the respective numerically controlled oscillators without further use of digital filters.

3. The digital high frequency modulation generator according to claim 2 wherein the two stored phase sequences are extended in time by two parallel digital real time interpolators.

4. The digital high frequency noise generator according to claim 2 wherein the two stored phase sequences are obtained by scanning in the frequency domain with a selectively predeterminable amplitude characteristic and simultaneously randomly selected phase.

* * * * *